United States Patent
Shin et al.

(10) Patent No.: US 6,479,364 B2
(45) Date of Patent: Nov. 12, 2002

(54) METHOD FOR FORMING A CAPACITOR FOR SEMICONDUCTOR DEVICES WITH DIFFUSION BARRIER LAYER ON BOTH SIDES OF DIELECTRIC LAYER

(75) Inventors: Dong Woo Shin, Kyoungki-do (KR); Seung Joon Jeon, Kyoungki-do (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/751,396

(22) Filed: Jan. 2, 2001

(65) Prior Publication Data

US 2001/0036708 A1 Nov. 1, 2001

(30) Foreign Application Priority Data

Dec. 30, 1999 (KR) ............................................. 99-66677

(51) Int. Cl.[7] ............................................. H01L 21/20
(52) U.S. Cl. ........................ 438/396; 438/253; 438/255; 438/240
(58) Field of Search ................................. 438/396, 397, 438/398, 253, 254, 653, 652, 654, 608, 686, 3, 240, 255, 482; 257/295, 316

(56) References Cited

U.S. PATENT DOCUMENTS 5,882,979 A * 3/1999 Ping et al. .................. 438/398
6,218,296 B1 * 4/2001 Kwak et al. ................ 438/653
6,316,307 B1 * 11/2001 Lee et al. .................... 438/239

FOREIGN PATENT DOCUMENTS

JP          11233723      * 8/1999

* cited by examiner

Primary Examiner—Olik Chaudhuri
Assistant Examiner—Yennhu B. Huynh
(74) Attorney, Agent, or Firm—Pillsbury Winthrop LLP

(57) ABSTRACT

A method for forming a capacitor for a semiconductor device is provided. In the method, a storage electrode is formed of a polysilicon layer, and a hemispherical silicate glass (HSG) layer is optionally formed on the surface of the storage electrode to increase the surface area of the storage electrode. Next, a TaSiN layer as a diffusion barrier is formed, a TaON layer as a dielectric layer is formed, and then a TaSiN layer is formed on the TaON layer. Next, a plate electrode is formed on the TaSiN layer, thereby completing a capacitor. Diffusion of oxygen between the electrodes and the dielectric layer is effectively blocked, so that reduction of capacitance and occurrence of leakage current are prevented. Due to improved dielectric characteristics of the TaON layer, increasing the surface area of the dielectric layer—for example, by forming a HSG layer—may not be required, thereby increasing a processing margin between adjacent capacitors. In addition, the thickness of the TaON layer can be adjusted, thereby raising the breakdown voltage of the TaON layer.

20 Claims, 4 Drawing Sheets

METHOD FOR FORMING A CAPACITOR FOR SEMICONDUCTOR DEVICES WITH DIFFUSION BARRIER LAYER ON BOTH SIDES OF DIELECTRIC LAYER

BACKGROUND OF THE INVENTION

1. Field of the Invention

The present invention relates to a method for forming a capacitor for semiconductor devices, and more particularly, to a method for forming a capacitor for highly integrated semiconductor devices, in which a TaON layer having a large dielectric constant is used as a dielectric layer.

2. Description of the Related Art

Recently, as the degree of integration of semiconductor devices has increased, the unit cell area decreased remarkably. As a result, manufacturing a capacitor having sufficient capacitance for such highly integrated semiconductor devices has become increasingly more difficult. In particular, in DRAM designs having one MOS transistor and one capacitor, the word lines and bit lines are arranged in a perpendicular relationship to one another over a semiconductor substrate, and the capacitor extends over two gates that are separated by a contact hole. In such arrangements, the capacitor occupies a large portion of the chip and includes a polysilicon layer as a conductive layer and an oxide layer, a nitride oxide (NO) layer, or an oxide-nitride-oxide (ONO) layer as a dielectric layer. In manufacturing highly integrated DRAMs, reducing the cell area of the capacitor while achieving high capacitance values becomes a critical design factor.

As known, capacitance (C) is expressed as $C = (\epsilon_0 \times \epsilon_r \times A)/T$, where $\epsilon_0$ is vacuum permitivity, $\epsilon_r$ is the dielectric constant of the dielectric layer, A is the surface area of the capacitor, and T is the thickness of the dielectric layer. As can be inferred from the expression, the capacitance can be increased by using a material having a large dielectric constant to form the dielectric layer, reducing the thickness of the dielectric layer, or increasing the surface area of the dielectric layer. However, each of these methods for increasing capacitance has problems associated with the respective method.

In particular, although there has been an active research into dielectric materials having a large dielectric constant—such as tantalum oxide ($Ta_2O_5$), titanium oxide ($TiO_2$) or BST $SrTiO_3$—the properties of these dielectric materials have not been sufficiently verified. For example, the effect of the dielectric materials on the reliability of devices in terms of the junction breakdown voltage and on the properties of the thin dielectric layer itself is unclear. Accordingly, it is difficult to utilize such dielectric materials in actual semiconductor device manufacturing processes.

On the other hand, reducing the thickness of the dielectric layer may cause the dielectric layer to punch through during operation, thereby lowering the reliability of the capacitor.

For 256 megabytes or greater DRAMs, a TaON layer—whose dielectric constant is 3–4 times larger than the conventional SiON layer that has a dielectric constant of about 7—has been suggested for use as the dielectric layer. However, the TaON layer raises a problem in actual manufacturing processes. During the deposition of the TaON layer and a subsequent thermal process, the TaON layer reacts with a polysilicon layer serving as a storage electrode, and as a result, a parasitic capacitor of $SiO_2$ is formed at the interface between the TaON layer and the storage electrode, which lower the overall capacitance value of the capacitor.

In particular, when a TaON layer is deposited by chemical vapor deposition (CVD) using $Ta(O(C_2H_5)_2)_5$ as a source material, and $O_2$ as a reaction gas, a polysilicon layer serving as a storage electrode is oxidized by oxygen originating from the source and reaction gases. Furthermore, oxygen is activated during subsequent low-temperature plasma treatment in a $N_2O$ atmosphere and during a high-temperature thermal process performed at about 600° C. to 800° C. for about 1 hour. The oxidation reaction of the storage electrode is facilitated by the activated oxygen, thereby resulting in a $SiO_2$ layer having a small dielectric constant between the storage electrode and the TaON layer.

The presence of the $SiO_2$ layer lowers the capacitance of the resultant semiconductor device. If no such intermediate layer exists between the TaON layer and the storage electrode, the total capacitance ($C_{tot}$) is equal to the capacitance ($C_{TaON}$) of the TaON layer. If an intermediate dielectric layer exists, the total capacitance $C_{tot}$ is dependent upon the dielectric constant ($\epsilon_{intermediate}$) and the thickness ($d_{intermediate}$) of the intermediate dielectric layer. This is expressed as:

$$C_{tot} = (C_{TaON} \times C_{intermediate})/(C_{TaON} + C_{intermediate}), \text{ where } C_{intermediate} = \epsilon_{intermediate}/d_{intermediate}.$$

FIG. 1 illustrates a capacitor for semiconductor devices manufactured according to a conventional method. As shown in FIG. 1, an oxide layer for isolation (not shown) and a gate oxide layer (not shown) are formed over a semiconductor substrate 41. Next, a MOS field effect transistor, which consists of a gate electrode (not shown) and source/drain electrodes (not shown) and bit lines (not shown) are formed. Then an interlayer dielectric (ILD) film 43 for planarization is deposited over the semiconductor substrate 41.

Following this, a photosensitive pattern (not shown) is formed on the ILD film 43, such that a portion of the ILD film 43, which serves as a storage electrode contact in conjunction with the source or drain electrode, is exposed. The ILD film 43 is etched using the photosensitive pattern as an etching mask to form a storage electrode contact hole. The photosensitive pattern is removed and a conductive layer (not shown) is deposited over the semiconductor substrate 41, filling the storage electrode contact hole. A core insulation layer (not shown) is formed over the conductive layer, and a storage electrode mask is formed on a portion of the core insulation layer aligned with a future storage electrode. The conductive layer and the core insulation layer are etched using the storage electrode mask as an etching mask, thereby resulting in a core insulation pattern (not shown) and a storage electrode 45.

Next, a conductive layer for spacer is deposited over the semiconductor substrate 41, and then etched to form a spacer 47 on the sidewalls of the storage electrode 45, so that a cylindrical storage electrode is completed. Then, the core insulation pattern is removed. A hemispherical silicate glass (HSG) layer 49 is optionally formed on the storage electrode 45 and the spacer 47 to increase the surface area of the storage electrode 45.

Next, a SiN layer 50 as a diffusion barrier is formed over the semiconductor substrate 41, and a TaON layer 51 as a dielectric layer is deposited over the SiN layer 50. A TiN layer 53 as a diffusion barrier and a plate electrode 55 are formed in succession, thereby resulting in a complete capacitor.

As previously mentioned, in such conventional method of forming a capacitor, to suppress a reduction in the total capacitance, the SiN layer having a thickness of 50 Å is formed as a diffusion barrier, such that diffusion of oxygen into the storage electrode, i.e., a lower electrode, can be prevented. However, such a thin SiN layer having a thickness of 50 Å cannot effectively block the diffusion of oxygen, and thus a $SiO_2$ layer is still formed between the lower electrode and the SiN layer.

On the other hand, when a high-temperature process is performed on the TaON layer that is formed as the dielectric layer for a denser structure, TaON is crystallized into $Ta_2O_5$ and nitrogen diffuses out of the dielectric layer. As a result, the number of free Ta atoms in the dielectric layer, from which oxygen is separated, increases, thereby deteriorating dielectric characteristics of the TaON layer. In addition, free Ta atoms serve as electron traps that cause leakage current, thereby degrading the properties of the capacitor.

SUMMARY OF THE INVENTION

To solve the above problems, it is an object of the present invention to provide a method for forming a capacitor for a semiconductor device, in which the dielectric characteristics of a TaON layer is improved in that it has higher capacitance values.

It is another object of the present invention to provide a method for forming a capacitor for a semiconductor device, in which diffusion of oxygen occurring between electrodes and a dielectric layer can be prevented, thereby preventing reduction in capacitance and occurrence of leakage current.

It is still another object of the present invention to provide a method for forming a capacitor for a semiconductor device, which reduces a need for forming a hemispherical silicate glass (HSG) layer to increase the surface of capacitor, so that a larger processing margin between capacitors is ensured.

In one embodiment, the present invention provides a method for forming a capacitor for a semiconductor device, comprising: forming a storage electrode on a semiconductor substrate; forming a hemispherical silicate glass layer on the storage electrode; forming a first TaSiN layer as a diffusion barrier on the hemispherical silicate glass layer; forming a TaON layer as a dielectric layer on the first TaSiN layer; forming a second TaSiN layer as a diffusion barrier on the TaON layer; and forming a plate electrode on the second TaSiN layer.

In another embodiment, the present invention provides a method for forming a capacitor of a semiconductor device, comprising: forming a storage electrode on a semiconductor substrate; forming a hemispherical silicate glass layer on the storage electrode; forming a first TaSiN layer as a diffusion barrier on the resultant surface; densifying the first TaSiN layer by a plasma process; forming a TaON layer as a dielectric layer on the resultant surface; forming a second TaSiN layer as a diffusion barrier on the TaON layer; densifying the second TaSiN layer by a plasma process; and densifying the second TaSiN layer, the TaON layer, and the first TaSiN layer by a rapid annealing process; and forming a plate electrode on the second TaSiN layer.

In still another embodiment, the present invention provides a method for forming a capacitor of a semiconductor device, comprising: forming a storage electrode on a semiconductor substrate; forming a hemispherical silicate glass layer on the storage electrode; forming a first TaSiN layer as a diffusion barrier on the resultant surface; densifying the first TaSiN layer by a plasma process; forming a first TaON layer on the resultant surface, performing a plasma process on the first TaON layer, and forming a second TaON layer on the first TaON layer, the first and second TaON layers serving as a dielectric layer; forming a second TaSiN layer as a diffusion barrier on the second TaON layer; densifying the second TaSiN layer by a plasma process; and densifying the second TaSiN layer, the second and first TaON layers, and the first TaSiN layer by a rapid annealing process; and forming a plate electrode on the second TaSiN layer.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1:
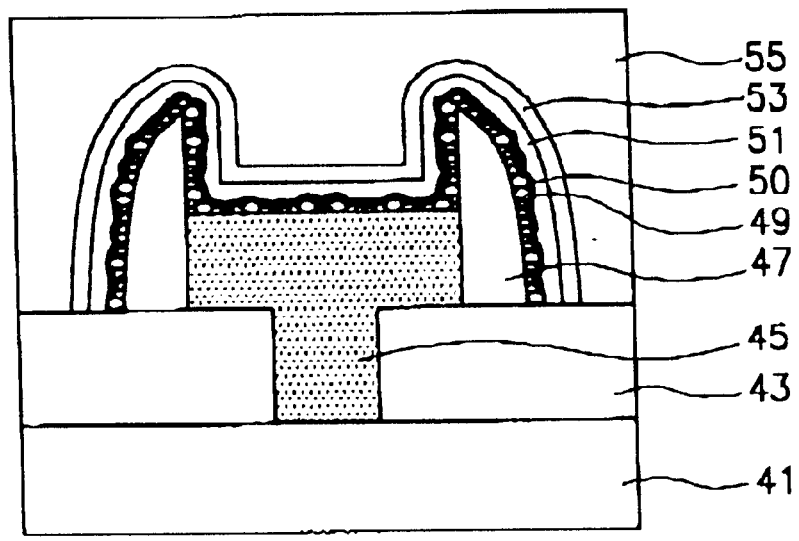
FIG. 1 illustrates a conventional method for forming a capacitor for a semiconductor device.
Figure 2:
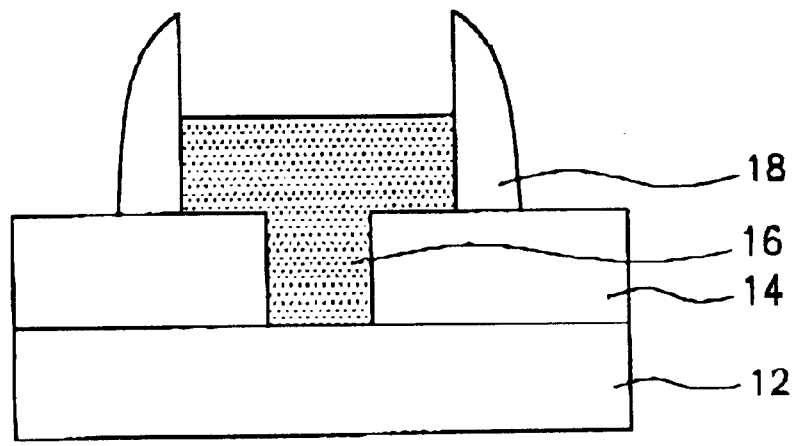
FIGS. 2 through 7 are sectional views illustrating a method for forming a capacitor for a semiconductor device according to the present invention.

A method for forming a capacitor of a semiconductor device according to the present invention will be described in greater detail with reference to FIGS. 2 through 7. Referring to FIG. 2, an element isolating oxide layer (not shown) and a gate oxide layer (not shown) are formed over a semiconductor substrate 12. Next, a MOS field effect transistor-which consists of a gate electrode (not shown) and source/drain electrodes (not shown)—and bit lines (not shown) are formed. Then, an interlayer dielectric (ILD) film 14 for planarization is deposited over the semiconductor substrate 12.

Following this, a photosensitive pattern (not shown) is formed on the ILD film 14, such that a portion of the ILD film 14, which serves as a storage electrode contact in conjunction with the source or drain electrode, is exposed. The ILD film 14 is etched using the photosensitive pattern as an etching mask to form a storage electrode contact hole. The photosensitive pattern is removed and a conductive layer (not shown) is deposited over the semiconductor substrate 12, filling the storage electrode contact hole. A core insulation layer (not shown) is formed over the conductive layer, and a storage electrode mask is formed on a portion of the core insulation layer aligned with a future storage electrode. The conductive layer and the core insulation layer are etched using the storage electrode mask as an etching mask, thereby resulting in a core insulation pattern (not shown) and a storage electrode 16.

Next, a conductive layer for spacer is deposited over the semiconductor substrate 21 to have a thickness of about 500 Å to 1,000Å, and then etched to form a spacer 18 on the sidewalls of the core insulation pattern and the storage electrode 16, so that a cylindrical storage electrode is completed. Then, the core insulation pattern is removed.

The storage electrode 16 and the spacer 18 as a phosphorous-doped polysilicon layer are formed in-situ using $PH_3$ gas. The storage electrode 16 contains phosphorus at a dose of about 3.0E20 atoms/$cm^2$, and the spacer 18 contains phosphorous at a dose of about 1E15 to 3E20 atoms/$cm^2$.

Figure 3:
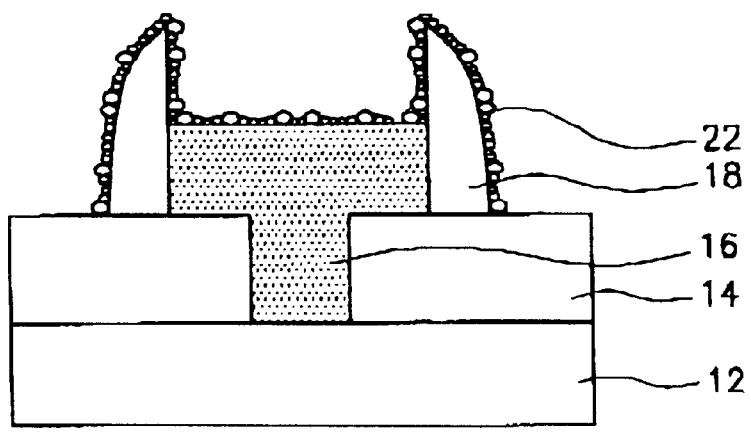
Figure 4:
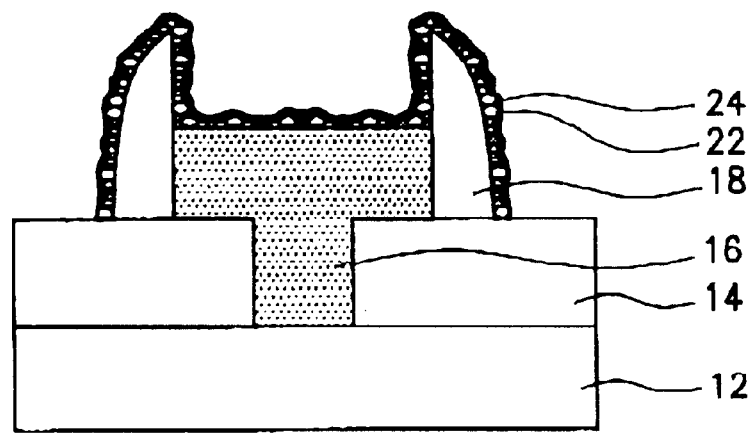

Following this, as shown in FIG. 3, a hemispherical silicate glass (HSG) layer 22 is optionally formed on the storage electrode 16 and the spacer 18, to increase the surface area of the storage electrode 16. The HSG layer 22 is grown to a thickness of about 100 Å to 300 Å at a temperature between about 600° C. and 650° C., using $Si_2H_6$ as a source gas. Then, the HSG layer 22 is doped with phosphorous in a $PH_3$ atmosphere by a plasma process.

Next, a first TaSiN layer 24 is formed over the HSG layer 22 as a diffusion barrier. The first TaSiN layer 24 acts to block diffusion of oxygen from a dielectric layer, which is to be formed in a subsequent process, to the storage electrode 16. The first TaSiN layer 24 is formed to have a thickness of about 100 Å to 500 Å using $TaCl_5$ as a solid source material, and $SiH_4$ and $NH_3$ as reaction gases, by low-pressure chemical vapor deposition (LPCVD). After the LPCVD, the fist TaSiN layer 14 is subjected to a plasma process in a $N_2$ or $H_2$ atmosphere for a denser structure. Alternatively, the first TaSiN layer 24 can be formed using $Ta(N(CH_3)_2)_5$ or $Ta(N(C_2H_5)_2)_5$ as an organic metal source material, $SiH_4$ as a Si source gas, and $NH_3$ as a reaction gas, at a temperature of about 450° C. to 600° C. by LPCVD. In this way, the plasma process at a low temperature is also carried out to make the structure of the first TaSiN layer 14 denser.

Figure 5:
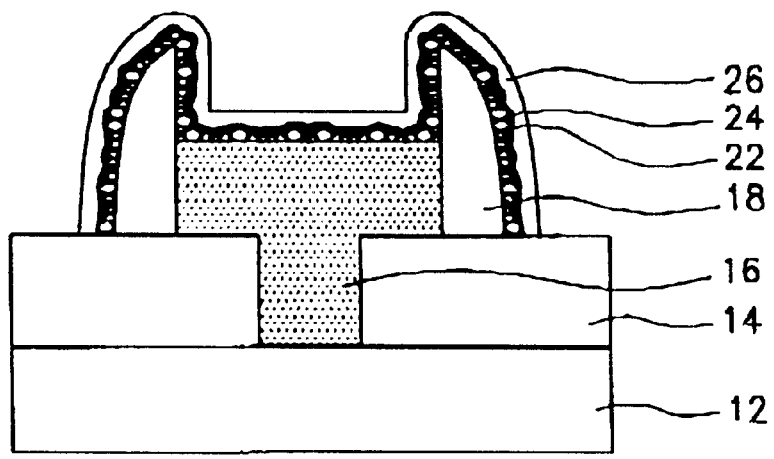

Following this, the first TaSiN layer 24 is etched for isolation of storage electrodes. As shown in FIG. 5, a TaON layer 26 is formed over the first TaSiN layer 24 as a dielectric layer. The TaON layer 26 is formed to have a thickness of about 100 Å to 120 Å using $Ta(OC_2H_5)_5$ as a source material, and $NH_3$ as a reaction gas, by metal organic chemical vapor deposition (MOCVD). Alternatively, to make the TaON layer 26 denser, the TaON layer 26 can be deposited in two steps, forming a thickness of about 50 Å to 60 Å each step. In this way, a plasma process in a $N_2O$ atmosphere is carried out in the two deposition steps.

Figure 6:
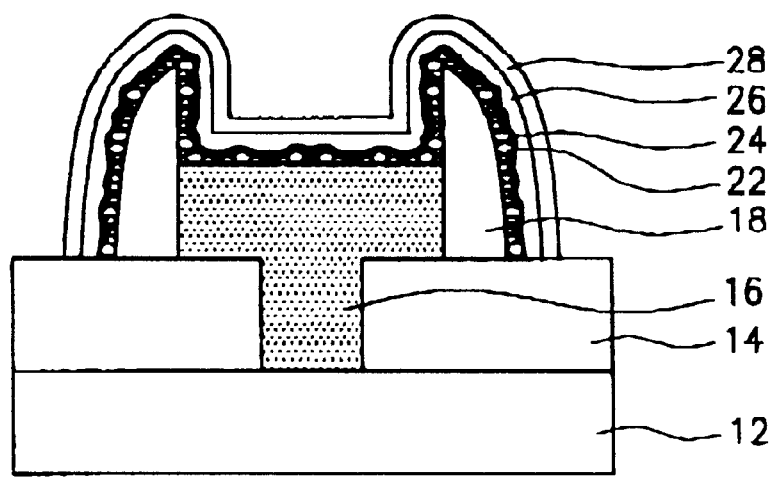

Next, as shown in FIG. 6, a second TaSiN layer 28 as a diffusion barrier is formed over the TaON layer 26. The second TaSiN layer 28 is formed in the same way as for the first TaSiN layer 24. The second TaSiN layer 26 serves to prevent diffusion of oxygen from the TaON layer 26 to a plate electrode, which will be formed in a subsequent process. Then, a rapid annealing process is carried out at a temperature between about 600° C. and 700° C. in a $N_2$ atmosphere, thereby densifying the second TaSiN layer, the TaON layer, and the first TaSiN layer 24.

Figure 7:
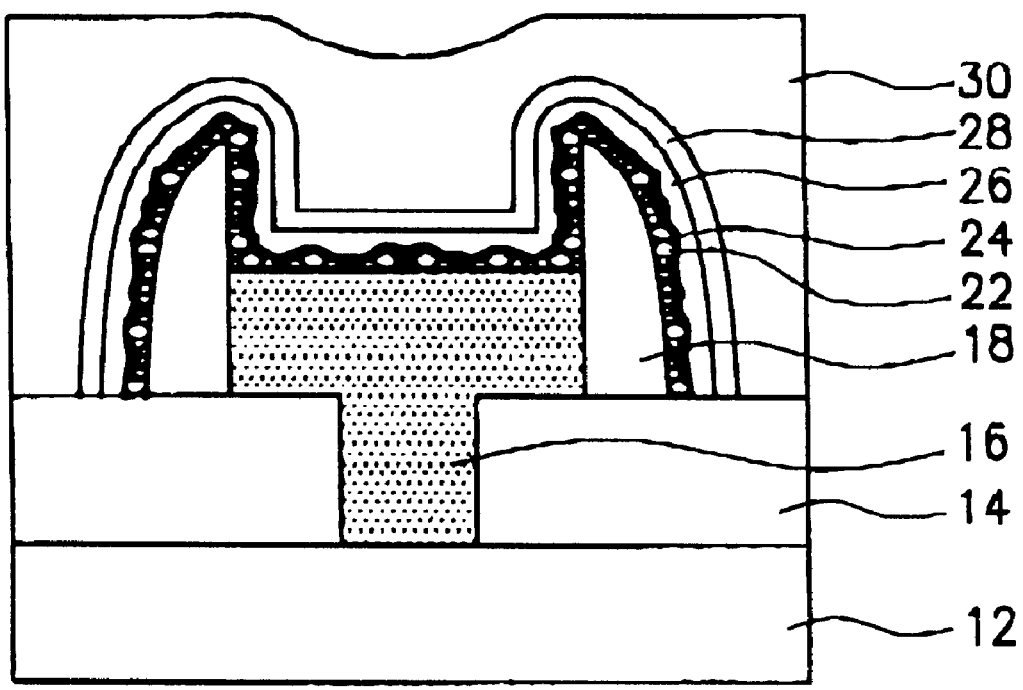

Next, as shown in FIG. 7, a conductive layer (not shown) for a plate electrode is formed over the semiconductor substrate 12 to have a thickness of about 700 Å to 1,200 Å, and a plate electrode mask is formed on a portion of the conductive layer to be the plate electrode. The conductive layer, the second TaSiN layer 28 and the TaON layer 26 are etched, thereby resulting in a plate electrode 30, a second TaSiN pattern and a TaON pattern. The plate electrode 30 is formed of the same material as that used for the storage electrode 16.

The method of forming a capacitor described above can be applied when a $Ta_2O_5$ layer is used as a dielectric layer. It will be appreciated that the formation of the HSG layer can be omitted if sufficient capacitance is ensured.

As previously mentioned, the method for forming a capacitor for a semiconductor device according to the present invention effectively prevents the diffusion of oxygen between electrodes and dielectric layer, so that reduction of capacitance and occurrence of leakage current can be prevented. Due to improved dielectric characteristic of the TaON layer, the step of increasing the surface area of the dielectric layer—for example, by forming a HSG layer—may not be needed thereby increasing a processing margin between adjacent capacitors. In addition, the thickness of the TaON layer can be adjusted, thereby raising the breakdown voltage of the TaON layer.

What is claimed is:

1. A method for forming a capacitor for a semiconductor device, comprising:
    forming a storage electrode on a semiconductor substrate;
    forming a hemispherical silicate glass layer on the storage electrode;
    forming a first TaSiN layer as a diffusion barrier on the hemispherical silicate glass layer;
    forming a TaON layer as a dielectric layer on the first TaSiN layer;
    forming a second TaSiN layer as a diffusion barrier on the TaON layer; and
    forming a plate electrode on the second TaSiN layer.

2. The method of claim 1, wherein each of the first TaSiN layer and the second TaSiN layer is formed to have a thickness in a range between about 100 Å and 500 Å using $TaCl_5$ as a solid source material, and $SiH_4$ and $NH_3$ as reaction gases, at a temperature between about 450° C. and 600° C. by low-pressure chemical vapor deposition (LPCVD).

3. The method of claim 2, wherein the first TaSiN layer and the second TaSiN layer are formed by using $Ta(N(CH_3)_2)_5$ or $Ta(N(C_2H_5)_2)_5$ as a source material.

4. The method of claim 1, after forming each of the first TaSiN layer and the second TaSiN layer, further comprising densifying each of the first and TaSiN layer and the second TaSiN layer in a $N_2$ and $H_2$ atmosphere by a plasma process.

5. The method of claim 3, wherein the TaON layer is formed to have a thickness between about 100 Å and 120 Å using $Ta(OC_2H_5)_5$ as a source material, and $NH_3$ as a reaction gas, by metal organic chemical vapor deposition (MOCVD).

6. The method of claim 1, wherein the TaON layer has a total thickness and consists of a first portion and a second portion, the first portion having a thickness of about half of the total thickness of the TaON layer and the second portion having a thickness of about half of the total thickness of the TaON layer, and
    forming the TaON layer comprises:
        forming the first portion of the TaON layer;
        performing a plasma process on the first portion of the TaON layer; and
        forming the second portion of the TaON layer.

7. The method of claim 1, after forming the second TaSiN layer, further comprising performing a rapid annealing process to densify the second TaSiN layer, the TaON layer and the first TaSiN layer.

8. The method of claim 7, wherein the rapid annealing process is performed at a temperature between about 600° C. and 700° C.

9. A method for forming a capacitor for a semiconductor device, comprising:
    forming a storage electrode on a semiconductor substrate;
    forming a hemispherical silicate glass layer on the storage electrode;
    forming a first TaSiN layer as a diffusion barrier;
    densifying the first TaSiN layer by a plasma process;
    forming a TaON layer as a dielectric layer;
    forming a second TaSiN layer as a diffusion barrier on the TaON layer;
    densifying the second TaSiN layer by a plasma process; and
    densifying the second TaSiN layer, the TaON layer, and the first TaSiN layer by a rapid annealing process; and
    forming a plate electrode on the second TaSiN layer.

10. The method of claim 9, wherein each of the first TaSiN layer and the second TaSiN layer is formed to have a thickness of about 100 Å to 500 Å using $TaCl_5$ as a solid source material, and $SiH_4$ and $NH_3$ as reaction gases, at a temperature between about 450° C. and 600° C. by low-pressure chemical vapor deposition (LPCVD).

11. The method of claim 9, wherein the first TaSiN layer and the second TaSiN layer are formed of using $Ta(N(CH_3)_2)_5$ba or $Ta(N(C_2H_5)_2)_5$ as a source material.

12. The method of claim 9, wherein the TaON layer is formed to have a thickness of about 100 Å to 120 Å using $Ta(OC_2H_5)_5$ as a source material, and $NH_3$ as a reaction gas, by metal organic chemical vapor deposition (MOCVD).

13. The method of claim 9, wherein
the TaON layer has a total thickness and consists of a first portion and a second portion, the first portion having a thickness of about half of the total thickness of the TaON layer and the second portion having a thickness of about half of the total thickness of the TaON layer, and forming the TaON layer comprises:
forming the first portion of the TaON layer;
performing a plasma process on the first portion of the TaON layer; and forming the second portion of the TaON layer.

14. The method of claim 9, wherein the rapid annealing process is performed at a temperature between about 600° C. and 700° C. in a $N_2$ atmosphere.

15. The method of claim 9, wherein the rapid annealing process is performed at a temperature between about 600° C. and 700° C. in a $N_2$ atmosphere.

16. A method for forming a capacitor for a semiconductor device, comprising:
forming a storage electrode on a semiconductor substrate;
forming a hemispherical silicate glass layer on the storage electrode;
forming a first TaSiN layer as a diffusion barrier;
densifying the first TaSiN layer by a plasma process;
forming a first TaON layer, performing a plasma process on the first TaON layer, and forming a second TaON layer on the first TaON layer, the first and second TaON layers serving as a dielectric layer;
forming a second TaSiN layer as a diffusion barrier on the second TaON layer;
densifying the second TaSiN layer by a plasma process; and
densifying the second TaSiN layer, the second and first TaON layers, and the first TaSiN layer by a rapid annealing process; and
forming a plate electrode on the second TaSiN layer.

17. The method of claim 16, wherein each of the first TaSiN layer and the second TaSiN layer is formed to have a thickness of about 100 Å to 500 Å using $TaCl_5$ as a solid source material, and $SiH_4$ and $NH_3$ as reaction gases, at a temperature between about 450° C. and 600° C. by low-pressure chemical vapor deposition (LPCVD).

18. The method of claim 16, wherein the first TaSiN layer and the second TaSiN layer are formed of using $Ta(N(CH_3)_2)_5$ or $Ta(N(C_2H_5)_2)_5$ as a source material.

19. The method of claim 16, wherein the first and second TaON layers are formed to have a total thickness of about 100 Å to 120 Å using $Ta(OC_2H_5)_5$ as a source material, and $NH_3$ as a reaction gas, by metal organic chemical vapor deposition (MOCVD).

20. The method of claim 19, wherein each of the first and second TaON layers has a thickness of about 50 Å to 60 Å.

* * * * *